United States Patent [19]
Chu

[11] Patent Number: 5,744,982
[45] Date of Patent: Apr. 28, 1998

[54] INPUT BUFFER CIRCUIT

[75] Inventor: Ke-Cheng Chu, Hsin-chu Hsien, Taiwan

[73] Assignee: Taiwan Semiconductor Manufacturing Company, Ltd., Hsin-chu, Taiwan

[21] Appl. No.: 636,087

[22] Filed: Apr. 22, 1996

[51] Int. Cl.$^6$ ............................................. H03K 19/0175
[52] U.S. Cl. ......................................... 326/83; 326/34
[58] Field of Search ................................ 326/83, 86, 34

[56] References Cited

U.S. PATENT DOCUMENTS

| | | | |
|---|---|---|---|
| 4,825,106 | 4/1989 | Tipon et al. | 326/83 |
| 5,144,165 | 9/1992 | Dhong et al. | 307/451 |
| 5,270,589 | 12/1993 | Sawada et al. | 307/475 |
| 5,300,835 | 4/1994 | Assar et al. | 307/475 |
| 5,304,872 | 4/1994 | Avraham et al. | 307/475 |
| 5,319,259 | 6/1994 | Merrill | 307/443 |
| 5,410,267 | 4/1995 | Haycock et al. | 326/81 |
| 5,422,592 | 6/1995 | Asahina | 327/427 |
| 5,426,383 | 6/1995 | Kumar | 326/83 |
| 5,495,185 | 2/1996 | Goto | 326/83 |
| 5,495,187 | 2/1996 | Martin | 326/83 |
| 5,541,534 | 7/1996 | Cao et al. | 326/83 |

*Primary Examiner*—Edward P. Westin
*Assistant Examiner*—Richard Roseen
*Attorney, Agent, or Firm*—George O. Saile; Stephen B. Ackerman; William S. Robertson

[57] ABSTRACT

A CMOS inverter has two p-channel FETs connected in series between $V_{DD}$ and the inverter output node, an upper FET connected to $V_{DD}$ and a lower FET connected to the output node. The gate of a upper FET and the gate of the inverter n-channel FET are connected to the circuit input through a series FET that protects the gate oxide of these FETs by turning off if a high voltage appears at the circuit input. The circuit is useful as a buffer that receives binary voltages that may be higher than the binary voltages of the circuits of the same chip. The gate of the upper p-channel FET is connected to the input and turns off fully to block a leakage current that would otherwise flow when the n-channel FET is turned on but the lower p-channel FET is left partly conducting by the voltage drop across the series FET. The gate oxide of the upper FET is protected because the partly conducting lower p-channel FET is turned off sufficiently to impede the charging current of the capacitor formed in part by the gate oxide.

10 Claims, 1 Drawing Sheet

INPUT BUFFER CIRCUIT

FIELD OF THE INVENTION

This invention relates generally to circuits for semiconductor devices and more specifically to an input buffer circuit for the pads of a semiconductor chip that receives an input signal.

INTRODUCTION

Semiconductor integrated circuit devices have input/output (I/O) pads where signal connections are made to other circuit. It is a familiar problem that the circuits of one chip operate with one power supply voltage and the circuits supplying the signal at the pad operate at a different power supply voltage. A buffer circuit receives the signals at the pad and produces an output that is suitable for the other circuits of the chip.

One known buffer circuit is formed by a conventional CMOS inverter. The inverter has an n-channel FET connected between the inverter output node and ground and a p-channel FET connected between the output node and the positive power supply terminal $V_{DD}$. The input pad is connected to the gates of the both FETs, and the FETs switch oppositely with the binary input signal because they have opposite channel types.

From a simplified viewpoint, the binary voltages that represent logic values are the same as the power supply voltages. As a further simplification, consider the case in which a 0 logic level is represented by a voltage at ground and a 1 logic level is represented by a positive power supply voltage. In this situation, the buffer converts a positive voltage at the pad to a positive voltage that is suitable for other circuits of the chip.

If a logical 1 at the pad has a lower voltage than the corresponding voltage of the chip, the buffer amplifies the signal to the desired level. If a logical 1 at the pad has a higher voltage, the buffer produces a positive voltage that is lower than the pad voltage. For example, when the conventional CMOS inverter turns off in response to a down level signal at the pad, the output can go not higher than the power supply voltage, which is the desired voltage to represent a logical 1 (the complement of the logical 0 at the pad).

When the signal at the input pad is high, the CMOS inverter produces a ground level output (representing the complement of the logical 1 at the pad), even though the pad voltage is higher than the voltage that represents a logical 1 at the buffer output.

The CMOS inverter has a problem when it is used as a buffer circuit: the higher voltage at the pad can stress the oxide of the gates.

THE PRIOR ART

In one of the prior art input circuit that avoids the stress problem, both gates of the inverter are connected to the input pad through an additional n-channel FET, which will be called the series n-channel FET. The series FET has its gate connected to $V_{DD}$ and it turns on when the voltage at its source terminal is less than VDD but turns off when the source terminal voltage is greater than VDD.

When the signal voltage at the pad is between ground and VDD, the series FET turns on and pulls both gates up or down, as in the operation of the CMOS inverter without the series FET. When the pad voltage for a logical 1 rises above VDD, the series FET turns off. The voltage VDD appears at the gates and the difference between the pad voltage and VDD appears across the series FET.

This prior art circuit has the problem that the p-channel FET does not turn off completely in response to a normal up level input signal. It conducts slightly because the normal voltage at its gate is reduced by the voltage drop across the series FET, and it conducts a leakage current when the n-channel FET is turned on. This leakage current is a serious problem in battery operated computers that would use these circuits.

In a second related prior art buffer circuit, a series FET is connected at the input pad, as described for the first prior art circuit, but it is connected to only the gate of the n-channel FET. An additional p-channel FET is connected as a resistor between the gate of the n-channel FET and VDD to pull up the gate when the series FET has been turned off by a high voltage at the pad. The gate of the inverter p-channel FET is connected directly to the pad, and it undergoes the high voltage stress that has been described for the simple CMOS inverter.

In both of these prior art circuits, the voltage drop across the series FET produces a level shift buffer output voltage.

SUMMARY OF THE INVENTION

The input circuit of this invention has the series FET of the prior art, but it solves the problems of the prior art circuits that have this feature.

The first stage of this circuit has a CMOS inverter with two p-channel FETs connected in series between $V_{DD}$ and the inverter output node (where the conventional CMOS inverter has one p-channel FET). The FET that is connected to the inverter output node (the "lower" FET) has its gate connected to the gate of the n-channel FET, (as in the gate connection of the single p-channel FET in the first prior art circuit), and the series FET protects this lower FET from a high voltage at the pad. As in the first prior art circuit, the lower FET does not turn off completely when the input signal is up.

The p-channel FET that is connected to $V_{DD}$ (the "upper" FET) has its gate connected directly to the circuit input (as in the gate connection of the single p-channel FET in the second prior art circuit). The upper p-channel FET turns off completely when the circuit input is up and it blocks the leakage current that would otherwise flow when the n-channel FET is on and the upper p-channel FET is only partly turned off.

The upper FET is protected from a high voltage at the input pad by the lower FET, as will be explained later. (By contrast, the single p-channel FET in the first prior art circuit is subjected to the higher voltage at the pad.)

In one embodiment of the invention, the first stage is followed by a conventional CMOS inverter that compensates for the level shift.

In a second embodiment of the invention, the first stage is followed by a level shift circuit that compensates for the level shift. The first embodiment is preferred because it has fewer devices than the second embodiment and it is faster.

THE DRAWING

THE PREFERRED EMBODIMENT

Introduction

Figure 1:
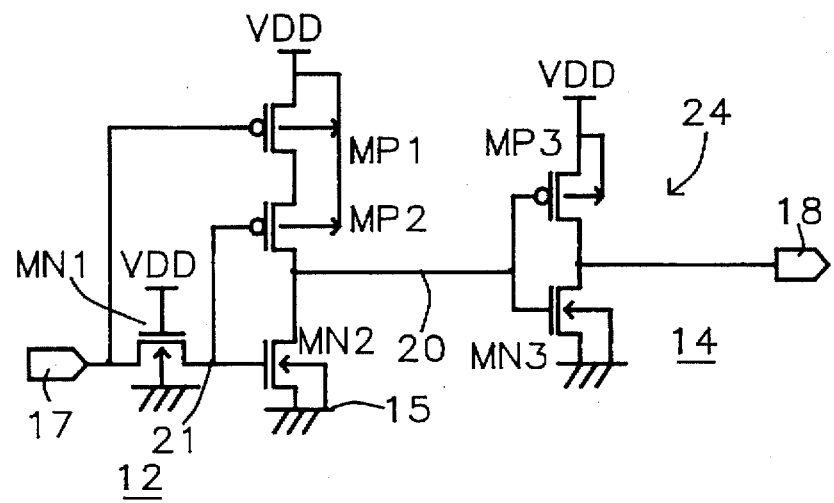
FIG. 1 is a schematic drawing of the first embodiment of the invention.

The buffer circuit will be described as two circuit stages, an input stage 12 (or first stage) on the left and a second stage 14 on the right. Besides these two circuit stages, the circuit has two power supply terminals, one a ground 15 and the other a positive terminal $V_{DD}$. The first stage of the circuit is connected to an input pad (terminal) 17 of the associated chip. Pad 17 is connected to carry signals from outside the chip, and voltages greater than $V_{DD}$ may appear at this terminal. The output of the second stage appears at a node 18, and circuits (not shown) on the same chip are connected to receive the signal at node 18.

Input Stage 12

An n-channel FET MN2 has its source connected to ground 15 and its drain connected to a first stage output node 20, as in a conventional CMOS inverter. The letters MN in these reference characters denote an n-channel FET and a numeral suffix identifies particular n-channel FETs. Similarly, the letters MP denote a p-channel FET.

The gate of FET MN2 is connected to the circuit input terminal 17 through an n-channel FET MN1. The common connection node for FETs MN1 and MN2 is designated node 21. As will be explained later, FET MN1 conducts in one direction when the signal at input terminal 17 is raised and in the opposite direction when this signal is lowered. Accordingly, it will be convenient to avoid the terms drain and source and instead to refer to these terminals by the reference characters 17 for the terminal connected to the input terminal 17 and the reference character 21 for the terminal that is connected to node 21. In the circuit operation that will be described later it will be readily understood that one of the terminals 17, 21 functions as the drain and the other functions as the source.

The gate of FET MN1 is connected to $V_{DD}$, which forms a reference voltage for turning this FET on and off in response to the voltage at pad 17. Thus, when FET MN1 is turned on by a normal signal voltage at pad 17, the voltage at node 21 differs from the voltage at input terminal 17 by the voltage drop across FET MN1 (as in the prior art described earlier).

Two p-channel FETs, MP1 (upper) and MP2 (lower) are connected in series between $V_{DD}$ and the first stage output node 20. The gate of upper FET MP1 is connected to receive the input signal at the pad 17, and the gate of lower FET MP2 is connected to receive the input signal at node 21. Thus, when FETs MP1 and MP2 receive a turn-on voltage (positive), the voltage at the gate of upper FET MP1 is positive with respect to the voltage at the gate of lower FET MP2 by the voltage drop across FET MN1.

When the voltage at pad 17 is down, n-channel FET MN1 turns on in response to this voltage with respect to the reference voltage at its gate, and it pulls down the voltage at node 21. Upper FET MP1 turns on in response to the down level voltage at pad 17, and lower FET MP2 turns on and lower FET MN2 turns off in response to the down level voltage at node 21. This operation pulls up the voltage at the first stage output node 20.

When the voltage at pad 17 is up but less than VDD, n-channel series FET MN1 turns on and pulls down the voltage at node 21, the converse of the preceding example of a low level voltage at pad 17. Lower FET MP2 turns partly off in response to the up level voltage at node 21 (which is shifted down by the drop across FET MN1). However, upper FET MP1 turns fully off in response to the up level voltage at pad 17 and thereby isolates first stage output node 20 from $V_{DD}$. FET MN2 turns on in response to the up level voltage at node 21 and pulls down the voltage at the first stage output node 20.

The gate oxide of an FET can break down if a sufficiently high voltage exists between the gate electrode and the charge in the semiconductor region underlying the gate. This voltage can be understood by thinking of the FET as a capacitor. The gate forms one plate of the capacitor, the charge in the underlying semiconductor forms the other plate, and the intervening oxide is the capacitor dielectric. The voltage on this capacitor increases as charge flows to the plates.

In upper FET MP1, this other plate is connected to ground primarily through the source-drain circuit of lower FET MP2. The capacitor of the gate oxide charges slowly through this path, and the gate oxide is protected against the high voltage pulses (of sufficiently short duration) that may appear at pad 17. Stated differently, part of the voltage at the pad 17 and the gate of upper FET MP1 appears across the source-drain circuit of lower FET MP2.

The voltage of the signal at output node 20 is similar to the conventional CMOS inverter (i.e. with a single p-channel FET instead of the series connection of FETs MN1 and MP1) except that an up level signal at node 20 is reduced by the voltage drop across the added p-channel FET in the drain circuit of FET MN2, and the down level of FET MN2 is above ground higher from the voltage drop across FET MN1. The level shifting circuit restores these voltage levels. The voltage at node 20, $V_{DD} - V_{TN}$, is within the operating range of FETs MN2 and MP2 and these FETs are protected by the voltage dropping action of FET MN1. ($V_{TN}$ is a threshold voltage between the gate and the source when conduction begins.)

In response to the voltage $V_{DD-VTN}$ at node 21, FET MN2 turns on and pulls down node 20 and lower FET MP2 is partly turned off.

The gate of upper FET MP1 may receive an over voltage at input terminal 17, as in the prior art. However, the circuit of this invention protects FET MP1. Since lower FET MP2 is partly turned off, it partly isolates node 22, the common connection point for FETs MP1 and MP2, and this node stays at about $V_DD - V_{TN}$.

The Second Stage Circuit of FIG. 1

The second stage of the preferred embodiment shown in FIG. 1 has an n-channel FET MN3 and a p-channel FET MP3 connected to form a conventional CMOS inverter 24. When the signal at pad 17 is up, the signal at node 21 is less than the pad voltage by the drop across FET MN1 and FET MN2 may not turn on sufficiently to pull down node 20 to the ground voltage that represents a logical 0. However, the second stage inverter produces a suitable output.

Figure 2:
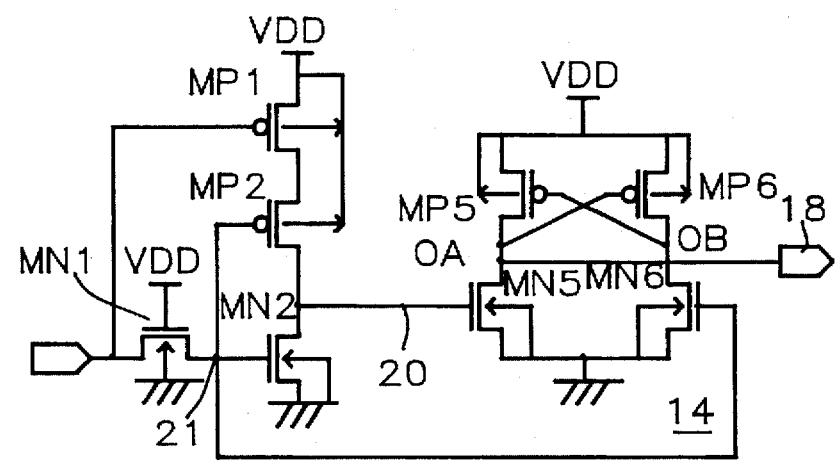
FIG. 2 is a schematic drawing of the second embodiment of the invention.

The Second Stage Circuit of FIG. 2

FIG. 2 shows the first stage output node 20 and the buffer circuit output node 18 which have been described in the circuit of FIG. 1. The second stage circuit has two n-channel FETs MN5 and MN6 and two p-channel FETs MP5 and MP6 are connected to form a level shifting circuit. Note that the circuit is symmetrical about a vertical centerline in the drawing: FETs MP5 and MN5 form a first inverter and FETs MP6 and MN6 form a second inverter. The common connection nodes of the drains of FETs MN5 and MP5 and FETs MN6 and MP6 are identified by legends OA and OB respectively (for output A and output B).

FETs MN5 and MN6 are connected to receive opposite phases of the signal at pad 17, and they switch oppositely. The gate of FET MN5 is connected to the output node 20 of the first stage, and FET MN5 is turned on and off oppositely to FET MN2 and in phase with the input signal. The gate of FET MN6 is connected to the gate of FET MN2, and FET MN6 is turned on and off with FET MN2 and in phase with the input signal.

When the signal at pad 17 is down, FETs MP1 and MP2 in the first stage turn on as already described and pull up node 20. However, the voltage drop across the series FET MN1 may prevent FET MP2 from turning on completely and the voltage drop across FET MP1 further lowers the voltage at node 20. Thus, the nominally up level voltage at the gate of FET MN5 may be lower than specified and the nominally down level voltage at the gate of FET MN6 may be higher than specified.

The level shifter output 18 is connected to node OA, the common connection of the drains of FETs MP5 and MN5, and the signal at output 18 has the same phase as the signal at pad 17. Alternatively, connecting output 18 node OB gives the signal at output 18 the opposite phase from the signal at pad 17.

The gates of p-channel FETs MP5 and MP6 are cross connected to the drains of n-channel FETs MN5 and MN6 to provide positive feed back that drives one of the outputs, OA or OB, fully high and the other fully low. When FET MN5 turns on (in response to a down level signal at pad 17 and a resulting up level signal at node 20), it pulls down node OA and the gate of FET MP6 and thereby turns on FET MP6. When FET MP6 turns on it pulls up node OB and the gate of FET MP5 and thereby turns off FET MP5.

During the operation just described, FET MN6 turns off in response to the signal at pad 17 and node 21 and thereby allows FET MP6 to pull up node OB as just described.

Other Embodiments

From the description of two embodiments of the invention, those skilled in the art will recognize variations in the details of implementation, within the skill of the art and the intended scope of the claims.

I claim:

1. A buffer circuit for connection between an input pad (17) of a semiconductor chip and a buffer circuit output node (18) where other circuits of the chip are connected, the chip having components adapted to operate with a power supply having a ground connection and a predetermined voltage connection and subject to damage when subjected to a voltage higher than said predetermined voltage, the input pad being connectable to receive binary input voltages with an up level higher than said predetermined voltage, whereby some components of the buffer circuit are exposed to higher voltages than they are adapted to operate with, the buffer circuit comprising a first stage comprising an n-channel FET (MN2) connected to conduct between a first node (20) and a circuit ground (15) and a upper p-channel FET (MP1) and a lower p-channel FET (MP2) connected to conduct in series between said first node (20) and a power supply point ($V_{DD}$), whereby the first node forms a first stage output node, the upper p-channel FET (MP1) being connected to the power supply point and the lower p-channel FET (MP2) being connected to the first output node (20), wherein the gate oxide of the upper FET (MP1) undergoes a voltage stress according to the voltage at its gate and a layer of charge carriers in the underlying semiconductor area, a series n-channel FET (MN1) connected between a circuit input pad (17) and a common connection point (21) of the gates of the n-channel FET (MN2) and the lower p-channel FET (MP2), the gate of the series FET being connected to a reference potential point ($V_{DD}$) to turn on when the input voltage is in the range of normal signal voltages but to turn off when the input voltages rises above the range of normal signal voltages, the gate of the upper FET being connected to the input pad and the upper FET turning off completely in response to an up level signal voltage at the input pad and thereby blocking a leakage current that would otherwise flow in the circuit of the lower p-channel FET and the n-channel FET when the n-channel FET is turned on and the voltage drop across the series FET leaves the lower p-channel FET only partly turned off, the lower p-channel FET conducting sufficiently to protect the upper p-channel FET when a signal higher than said predetermined voltage appears at the input pad and at the gate of the upper p-channel FET and a second stage circuit comprising two n-channel FETs (MN5 and MN6) and two p-channel FETs (MP5 and MP6) connected to form a level shifting circuit, the second stage being connecting to said first node (20) to restore a voltage shift at the first node caused by the voltage drop across one of said FETs.

2. The buffer circuit of claim 1 wherein the voltage shift at said first stage output node is caused by the voltage drop across the series FET.

3. The buffer circuit of claim 1 wherein the charge carriers in the underlying semiconductor area are controlled by the conduction of the lower FET (MP2) and wherein the lower FET remains partly conductive from the voltage drop across the series FET.

4. The buffer circuit of claim 3 wherein the underlying charge layer and the gate of the upper FET form a capacitor that charges slowly during the appearance of an up level voltage at the pad.

5. The buffer circuit of claim 1 wherein the underlying charge layer is connected to ground primarily through the source-drain circuit of the lower FET.

6. The buffer circuit of claim 1 wherein the second stage circuit comprises a CMOS inverter adapted to restore the binary voltage levels at said first stage output node.

7. The buffer circuit of claim 6 wherein the second stage CMOS inverter comprises an n-channel FET (MN3) connected to conduct between the buffer circuit output node (18) and ground (15) in response to an up level signal at the first stage output node (20) and a p-channel FET connected to conduct between the buffer circuit output node and the predetermined voltage of the power supply in response to a down level at the first stage output node.

8. The buffer circuit of claim 1 wherein one n-channel FET and one p-channel FET of the second stage are connected to form a first inverter and the other n-channel FET and other p-channel FET of the second stage are connected to form a second inverter.

9. The buffer circuit of claim 8 wherein the two inverters are cross connected to provide positive feed back.

10. The buffer circuit of claim 9 wherein the n-channel FET of one inverter has its gate connected to the first stage output node and the other n-channel FET has its gate connected to said common connection point (21), whereby the two inverters receive opposite phase signals.

* * * * *